United States Patent Office 3,243,373

Patented Mar. 29, 1966

3,243,373

METHOD OF DOPING SEMICONDUCTOR MATERIAL, PARTICULARLY SILICON, WITH BORON

Konrad Reuschel, Pretzfeld, Lower Rhine, Germany, assignor to Siemens-Schuckertwerke Aktiengesellschaft, Erlangen, Germany, a German corporation No Drawing. Filed May 4, 1962, Ser. No. 192,325
Claims priority, application Germany, May 16, 1961, S 73,985
7 Claims. (Cl. 252—62.3)

My invention relates to a method of controlled doping bodies of electronically pure silicon or other semiconductor material with boron.

Electronic semiconductor devices, such as rectifiers, transistors, photodiodes, semiconductor controlled switches and other four-layer junction devices and the like, usually comprise an essentially monocrystalline semiconductor body, for example of silicon, germanium, or an intermetallic compound of elements from the third and fifth groups respectively of the periodic system such as indium antimonide, indium arsenide or gallium phosphide, or of an intermetallic compound of elements from the second and sixth groups of the periodic system, for example calcium telluride. The monocrystalline semiconductor body is provided with electrodes which are joined with the semiconductor material, for example by alloying. The production of the semiconductor bodies requires the use of relatively large quantities of semiconductor materials having prescribed properties. To secure these properties, the materials are highly purified, for example by floating-zone melting and are subsequently fabricated in the highly purified condition thus attained or after adding defined doping additions, in order to produce electronic semiconductor devices.

According to one of the known methods of thus applying doping substance to highly pure semiconductor material, undoped semiconductor material is pyrolytically precipitated upon a thin rod-shaped core body of the same semiconductor material which, however, is strongly doped, and thereafter the doping concentration is uniformly distributed over the entire cross section of the resulting thickened semiconductor rod by subjecting it to crucible-free (floating) zone melting. Such a method is described in U.S. Patent 2,970,111, of Hoffman et al. For the purpose of this method as well as for other semiconductor manufacturing purposes, a highly doped semiconductor material is required.

Boron has the property of an intensively doping action in silicon, germanium and other semiconductor material. Various methods for entering boron into semiconductor material have beecome known. For example, it is known to fuse a boron-containing filament of glass onto a semiconductor rod and thereafter subjecting the rod to crucible-free zone melting.

My invention, in a more particular aspect, relates to a method generally of the last-mentioned type according to which semiconductor material, particularly silicon, is doped with boron by depositing boron on a rod-shaped body of the semiconductor material and then subjecting the body to crucible-free zone melting.

It is an object of my invention to facilitate performing such a method and to also improve the suitability and reliability of the resulting highly doped material for subsequent growing of monocrystals.

To this end, and in accordance with my invention, the doping with boron is effected by placing boron powder in a grain size of 5 to 500 microns onto the rod-shaped body of silicon or other semiconductor material to be processed, and subsequently subjecting the body together with the boron granules thereon to zone melting for distributing the boron throughout the cross section and treated length of the semiconductor body.

According to a more specific feature, the boron granules are preferably given a diameter within the range of 50 to 100 microns.

I have discovered that boron in such a grain size is particularly well suitable for entering the boron into semiconductor material in order to reliably and expeditiously obtain the desired doping. Boron powder of smaller grain size, for example pulverulent boron, has the disadvantage, in comparison, that the nitride skins that form in air impede the entrance of boron into the semiconductor material. Furthermore, boron nitride which has penetrated together with the boron into the semiconductor material, for example into silicon or germanium, has been found detrimental when subsequently converting the doped material into a monocrystal because the nitride inclusions then constitute noxious lattice disturbances.

On the other hand, there is also an upper limit for the grain size because large boron granules form mix crystals with the semiconductor material when the latter is being melted. For that reason a very long melting period is necessary when the grain size of the boron is too large because otherwise the alloys that form themselves from the boron and the semiconductor material likewise prevent or impede the growth of monocrystals.

Further details and advantages of the invention will be apparent from the following description of an example.

A semiconductor rod, for example of silicon, having a total weight of approximately 100 g. a length of 25 cm. and a diameter of 14.5 mm., is provided with a groove, for example by milling, which extends parallel to the longitudinal axis of the rod. The groove may extend substantially the entire length of the rod and has a width of about 2 mm. and a depth of about 1 mm. The exact dimensions of said groove are not critical although a groove substantially the entire length of the rod will facilitate the subsequent zone-leveling of the doping addition. About 200 mg. boron are mixed together with waterglass by stirring at normal room temperature, the boron having a grain size of 50 to 100 microns. The quantity of waterglass used is not critical although about 100 to 200 mg. is preferable for about 200 mg. of boron. The mixture is given a tacky consistency and is placed into the groove. The semiconductor body is subsequently slowly heated up to about 900° C. and is kept at this temperature for a period of several hours, approximately three hours. This eliminates the humidity of the waterglass as well as the chemically bound water which would be detrimental during the subsequent zone melting.

Thereafter a melting zone is passed along the entire semiconductor rod between its two attached ends. As a result, a glassy slag is formed on the surface of the semiconductor rod consisting of the residue of the waterglass. Thereafter the slag is removed, for example by scraping it off. Thereafter at least one further zone-melting pass is performed throughout the treated length of the semiconductor rod. After such processing the semiconductor material, whose original specific resistance was about 100 to 500 ohm-cm., exhibits a specific resistance of $4 \cdot 10^{-3}$ ohm-cm. Consequently, the semiconductor rod is now highly doped with boron.

In most cases it is preferable to convert the semiconductor rod to a monocrystal by fusing a monocrystalline seed to one end of the boron-doped rod and then subjecting the rod to zone melting with each pass commencing at the crystal seed. It has been found preferable to fuse the monocrystalline seed to the rod only before performing the second zone-melting pass. That is, the starting point of the melting pass should be placed into the seed only for the second pass, whereas the first zone-melting pass performed with the previously boron-doped rod is performed without attempting to obtain a monocrystalline product. When thus proceeding, a polycrystalline-tomonocrystalline conversion is effected only after the boron is well distributed throughout the semiconductor body.

The process according to the invention is applicable in the same way for rods of germanium as well as to other semiconductor materials for which boron acts as a doping agent.

I claim:

1. A method for producing a rod of low-ohmic semiconductor material, having a predetermined conductance obtained by controlled doping, which comprises attaching boron granules having a grain size of 5 to 500 microns onto and along a rod-shaped body of the semiconductor material, and thereafter subjecting the semiconductor body to zone melting.

2. A method for producing a rod of low-ohmic semiconductor silicon, having a predetermined conductance obtained by controlled doping, which comprises attaching boron granules having a grain size of 5 to 500 microns onto and along a rod-shaped body of silicon, and thereafter subjecting the semiconductor body to zone melting.

3. A method for producing a rod of low-ohmic semiconductor silicon, having a predetermined conductance obtained by controlled doping, which comprises attaching boron granules having a grain size of 50 to 100 microns onto and along a rod-shaped body of silicon, and thereafter subjecting the semiconductor body to zone melting.

4. A method for producing a rod of low-ohmic semiconductor material, having a predetermined conductance obtained by controlled doping, which comprises providing a longitudinal groove along a portion of the length of a rod-shaped body of semiconductor material, placing boron granules having a grain size of 5 to 500 microns into said groove and thereafter subjecting the body to zone melting.

5. A method for producing a rod of low-ohmic semiconductor material, having a predetermined conductance obtained by controlled doping, which comprises providing a longitudinal groove along a portion of the length of a rod-shaped body of semiconductor material, placing boron granules having a grain size of 50 to 500 microns into said groove and fastening said granules to said groove by waterglass and thereafter subjecting the body to crucible-free zone melting.

6. A method for producing a rod of low-ohmic semiconductor material, having a predetermined conductance obtained by controlled doping, which comprises placing a mixture of waterglass and boron granules having a grain size of from 50 to 100 microns onto said semiconductor body, slowly heating said body to about 900° C. and maintaining this temperature for several hours, and thereafter subjecting said body to zone melting.

7. A method for producing a rod of low-ohmic semiconductor material, having a predetermined conductance obtained by controlled doping, which comprises placing a mixture of boron granules having a grain size of from 50 to 100 microns and waterglass onto said semiconductor body, slowly heating said body to about 900° C. and maintaining this temperature for several hours, and thereafter subjecting said body to a zone melting pass, after said zone melting pass removing the slags stemming from the waterglass from the silicon body and subjecting said body to at least one more zone melting pass.

References Cited by the Examiner

UNITED STATES PATENTS

| | | | |
|---|---|---|---|
| 2,739,088 | 3/1956 | Pfann. | |
| 2,898,249 | 8/1959 | Jensen | 252—62.3 |
| 2,970,111 | 1/1961 | Hoffman et al. | 252—62.3 |
| 3,060,123 | 10/1962 | Theuerer | 252—62.3 |

SAMUEL H. BLECH, *Primary Examiner.*

MAURICE A. BRINDISI, *Examiner.*

S. R. BRESCH. R. D. EDMONDS. *Assistant Examiners.*